United States Patent [19]

Macpherson

[11] Patent Number: 5,017,908
[45] Date of Patent: May 21, 1991

[54] SOLVENT RESPONSIVE SIGNAL-CARRYING DEVICE

[76] Inventor: Hugh Macpherson, 12 Balfour Crescent, Milnathort, Tayside, KY13 7TA, Scotland

[21] Appl. No.: 501,624

[22] Filed: Mar. 28, 1990

[30] Foreign Application Priority Data

Apr. 4, 1989 [GB] United Kingdom ............... 8907548

[51] Int. Cl.⁵ ............................................. G08B 21/00
[52] U.S. Cl. ................................ 340/605; 340/604; 73/40.52; 174/11 R
[58] Field of Search ............... 340/604, 605, 603; 174/11 R; 73/40.5 R; 324/557

[56] References Cited

U.S. PATENT DOCUMENTS

| 4,859,989 | 8/1989 | McPherson | 340/550 X |
| 4,896,527 | 1/1990 | Akida | 174/11 R X |

FOREIGN PATENT DOCUMENTS 2413996 12/1974 Fed. Rep. of Germany .
0135375 11/1978 Japan .

Primary Examiner—Joseph A. Orsino
Assistant Examiner—Jeffery A. Hofsass
Attorney, Agent, or Firm—Dena Meyer Weker

[57] ABSTRACT

A signal-carrying member responsive to the presence of a solvent and suitable for use in a security cable or a liquid leakage detector, comprises a conductive ink 20, consisting of a particulate conductive material and a non-conductive carrier medium, printed on to a non-conductive strip 17 and conductors 16 such that when the printed material is contacted by a solvent to which the carrier medium is sensitive, conductive material will be released from the printed material and can be used to vary a signal passed through the signal-carrying member.

2 Claims, 2 Drawing Sheets

SOLVENT RESPONSIVE SIGNAL-CARRYING DEVICE

FIELD OF THE INVENTION

This invention relates to a signal-carrying device, in particular for a security or detector system, which is responsive to the presence of a solvent.

BACKGROUND OF THE INVENTION

Leaks of hydrocarbons and other chemical products from storage tanks or pipelines can cause environmental damage including ground water contamination. Alternatively, contamination of electrical equipment by hydrocarbons and other chemical products may also cause severe damage to the equipment.

Further, known methods to detect solvents generally use a coaxial cable structure whereby the solvent is absorbed into the dielectric material and thereby change its electrical properties. These methods are slow to react and it is often preferred that the detector cable be submerged in the solvent. Also, these methods do not perform well at detecting viscous solvents having a surface tension greater than 20 mN m$^{-1}$. The methods also tend to be non-specific and may give false alarms in the presence of contaminants such as oils. There is a need for a simple device for detection of solvent leaks.

SUMMARY OF THE INVENTION

The invention is applicable, in one sense, to a signal-carrying cable provided with a security system which is designed to protect against interference with the cable. The invention is applicable, in another sense, to a fluid-containing system, such for example an oil pipeline, having a sensor for sensing leakage of the fluid from the container.

The words "conductor" and "conductive" when used hereinafter should be read as including "semi-conductor" or "semi-conductive" whenever the context permits.

According to the one aspect of the present invention there is provided a signal-carrying device for a security or detector system comprising a conductor extending along a non-conductive surface, said conductor being composed of particulate conductive material held in a carrier medium which is soluble in at least one solvent, such that when the carrier medium is contacted by a said solvent, it will release conductive material therefrom sufficient to interrupt the conductive path through the conductive material and/or form a short circuit between said two conductors.

According to another aspect, the present invention provides a signal-carrying device for a security or detector system comprising at least two conductors extending along a non-conductive surface in side-by-side spaced apart relationship, at least one of said conductors being formed of particulate conductive material held in a carrier medium which is soluble in at least one solvent, such that when the carrier medium is contacted by a said solvent, it will release conductive material therefrom sufficient to interrupt the conductive path through the conductive material and/or form a short circuit between said two conductors.

According to a further aspect, the present invention provides a signal-carrying device for security or detector system comprising at least two conductors extending in spaced-apart side-by-side relationship and insulated from each other by non-conductive material, a layer containing conductive material in a non-conductive carrier medium so printed over, or otherwise applied over, said conductors that the said conductors are not thereby electrically short circuited, the non-conductive carrier medium being soluble in a solvent such that when said solvent is applied to the layer the non-conductive carrier will dissolve and permit the conductive material to migrate between said conductors and short circuit therebetween.

DETAILED DESCRIPTION OF THE PREFERRED EMBODIMENTS

Figure 1:
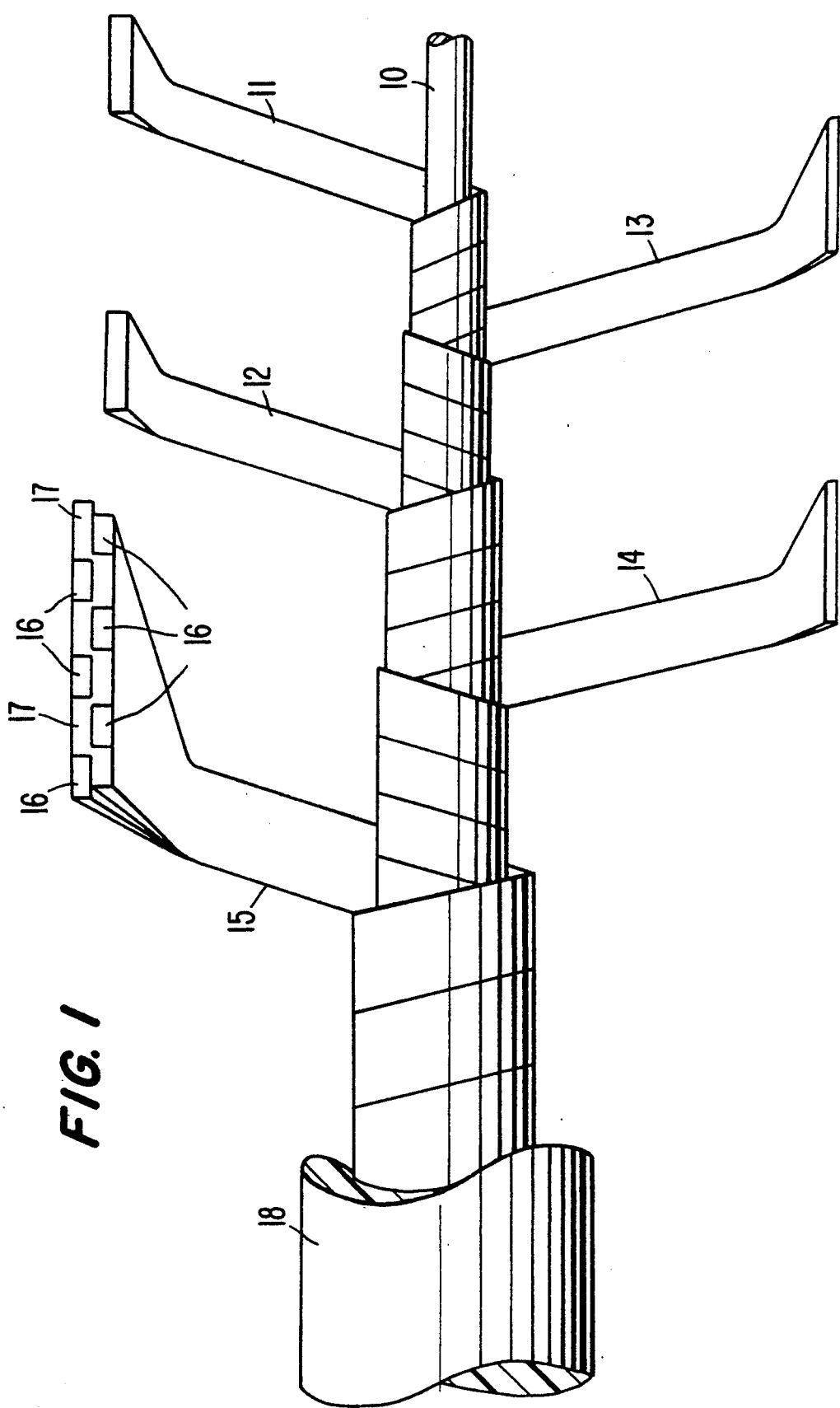
FIG. 1 is a diagrammatic illustration of the process of manufacture of a security cable.

The security cable shown in FIG. 1 forms the subject of U.S. Pat. No. 4,859,989 to which attention is directed for a detailed explanation. For the purpose of the present invention, it is sufficient to say that a core 10 is over-wrapped by alternating layers 11,12 of conductive tape and insulating tape 13,14. A fifth layer can be wrapped which comprises conductive strips 16 embedded in a layer of insulating material 17. The conductive layers are of a fibrous nature such that, when penetrated by a sharp instrument, conductive fibers will be carried through the intervening insulating layer and cause short-circuiting between adjacent conductive strips, and this short-circuiting can be detected by sensing apparatus connected at a selected position on the cable.

This cable, as shown, is enclosed within a jacket 18 which will be bonded to the outermost layer by a suitable adhesive.

Figure 2:
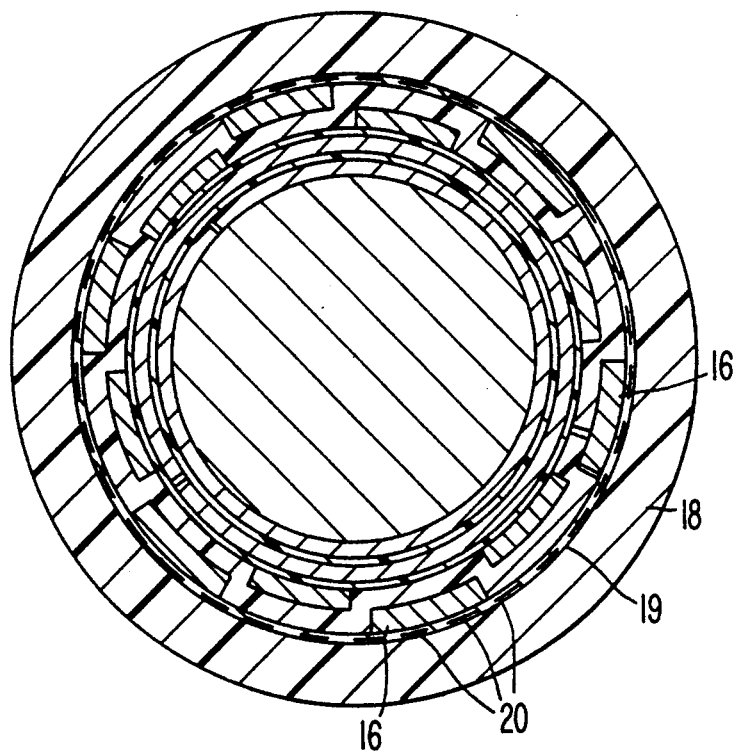
FIG. 2 is a section through the completed cable showing a pattern of printed conductors beneath the jacket of the cable.
Figure 3:
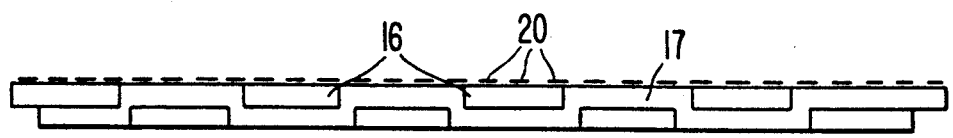
FIG. 3 is a development of part of the cable of FIG. 2.

In accordance with the first embodiment of the invention shown in FIGS. 2 and 3, the outermost layer 15 of the cable, which in this case is a composite layer of conductive strips 16 embedded in plastic material 17, is coated with a printed conductive coating 19. This coating, as illustrated, comprises a plurality of parallel-spaced lines 20 printed in conductive ink so that they form an electrically-conductive path which can carry a signal. The conductive ink used to form the coating (and which is described in greater detail below) comprises a conductive filler carried in a carrier medium which is soluble in one or more solvents such that if this coating is contacted by such a solvent, one or more of the printed lines will dissolve or go into suspension. This will permit the conductive particles which it comprises to migrate and so interrupt the conductive path through the printed line or complete a short circuit with an adjacent printed line or between two conductors 16. In this event, a signal passed through the printed lines or conductors 16 will be interrupted or otherwise varied, and this variation can be detected by a sensor connected at a selected position along the cable.

It will be apparent from this specific description of a cable that the invention can be utilized in a broader aspect.

As a first example, a tape or film of non-conductive material bearing conductive strips, printed from the material described above, can be wrapped around or otherwise applied to the outside of a liquid container such as a tank or pipeline, to detect leakage of liquid from the container. The printed film will be printed by use of a conductive ink of which the carrier component is soluble in the liquid contained within the container.

As a second example, a tape or film of non-conductive material along which conductors extend in parallel-spaced relationship, (the conductors having been printed or otherwise formed) is covered with a layer of carrier medium free from conductive material, so that it forms a thin insulating layer over the conductors. A conductive layer is then printed over the insulating layer using the conductive ink.

The conductive layer can be an uninterrupted layer or printed in a pattern of lines or dots or in a random pattern. In the event of solvent coming into contact with the printed layer it will dissolve through this layer and the insulating layer beneath it and allow conductive particles of the ink to migrate into contact with the conductors and produce short circuiting between adjacent conductors.

As a third example, a tape or film of non-conductive material along which conductors extend in parallel-spaced relationship (the conductors having been printed or otherwise formed), is overprinted with the above-described conductive ink. The ink is applied so that it does not short circuit the conductors but such that upon contact with a said solvent, conductive material will be released from, or will migrate from, the ink to short circuit adjacent conductors. By way of example, the ink can be printed in a series of dots superimposed on the conductors and insulation such that the dot diameter is less than the insulation spacing the conductors.

The conductive printing material, referred to herein as "ink", can comprise a particulate conductive material or filler, such as graphite, or other carbon, or a mixture thereof, and in particular is known as carbon black and foliac graphite. The conductive material may be carried in a carrier medium which is soluble in at least one solvent, and preferably in a wide range of solvents. The carrier medium can be a short chain polyester resin such as that sold under reference No. 49001 by Dupont. In order that the mixture of the conductive filler and the carrier medium may be printed, a solvent is added such as acetone.

The ink is preferably applied to a tape or film of insulating material, such as a membrane of expanded polytetrafluoroethylene, for example that is sold under the registered trade mark GORE-TEX by H. L. Gore & Associates, Inc. The ink can be printed by conventional transfer printing methods onto a tape or film to which conductive terminal elements had already been attached. The ink can be applied in straight parallel-spaced lines or in any other selected pattern from a roller or wheel on which the pattern had been etched. The lower part of the roller is arranged in a bath containing the ink, and the film to be printed is caused to move in contact with the top of the roller so that ink is picked up from the bath and transferred to the film.

I claim:

1. A signal-carrying device for a security or detector system comprising at least two conductors extending in spaced-apart side-by-side relationship and insulated from each other by non-conductive material, a layer containing conductive material in a non-conductive carrier medium so printed over, or otherwise applied over said conductors such that the said conductors are not thereby electrically short circuited, the non-conductive carrier medium being soluble in a solvent such that when said solvent is applied to the layer the non-conductive carrier will dissolve and permit the conductive material to migrate between said conductors and short circuit therebetween.

2. A signal-carrying device according to claim 1 having a jacket surrounding the conductors and secured in position by an adhesive, said adhesive and said carrier medium being soluble in a common solvent.

* * * * *